US006333594B1

(12) United States Patent
Nakagawa et al.

(10) Patent No.: US 6,333,594 B1
(45) Date of Patent: Dec. 25, 2001

(54) COLOR CATHODE RAY TUBE HAVING PARTICULAR EFFECTIVE INNER PANEL SURFACE AND SHADOW MASK EFFECTIVE SURFACE SHAPES

(75) Inventors: Shinichiro Nakagawa; Norio Shimizu, both of Fukaya; Masatsugu Inoue, Kumagaya, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/220,342

(22) Filed: Dec. 24, 1998

(30) Foreign Application Priority Data

Dec. 26, 1997 (JP) .................................................. 9-360759
Oct. 27, 1998 (JP) ................................................ 10-305362

(51) Int. Cl.[7] ............................. H01J 29/10; H01J 29/80; H01J 31/00; H01J 61/30

(52) U.S. Cl. .......................... 313/461; 313/402; 313/407; 313/408; 313/477 R; 220/2.1 A

(58) Field of Search ............................. 220/2.1 A, 2.1 R; 313/477 R, 461, 402, 407, 408

(56) References Cited

U.S. PATENT DOCUMENTS 4,136,300 1/1979 Morrell .
4,741,315 5/1988 Febrenbach et al. .
4,881,004 * 11/1989 Inoue et al. .......................... 313/408
4,985,658 1/1991 Canevazzi .
5,216,321 6/1993 Kawamura et al. .
5,606,217 2/1997 Hirai et al. .
5,964,364 * 10/1999 Shimizu et al. ................. 313/477 R

FOREIGN PATENT DOCUMENTS 0 612 094 8/1994 (EP) .
0 899 769 3/1999 (EP) .
0 913 852 5/1999 (EP) .
0 923 107 6/1999 (EP) .
WO 97 33298 9/1997 (WO) .

* cited by examiner

*Primary Examiner*—Vip Patel
*Assistant Examiner*—Mack Haynes
(74) *Attorney, Agent, or Firm*—Oblon, Spivak, McClelland, Maier & Neustadt, P.C.

(57) ABSTRACT

Provided is a color cathode ray tube, which comprises a panel including a substantially rectangular effective portion, of which the outer surface is a flat surface or a slightly curved surface, and a shadow mask having an effective surface opposite the inner surface of the effective portion of the panel. In this color cathode ray tube, the inner surface of the effective portion of the panel is a curved surface having a substantially infinite curvature radius RXp1 in the major-axis direction on the major axis thereof near the center, a predetermined curvature radius RXp2 in the major-axis direction near peripheral portions on the major axis, and another predetermined curvature radius in the minor-axis direction on the minor axis thereof. This color cathode ray tube, with its panel having the substantially flat outer surface, enjoys improved visibility and higher strength for the maintenance of the curved surface of the shadow mask.

8 Claims, 2 Drawing Sheets

COLOR CATHODE RAY TUBE HAVING PARTICULAR EFFECTIVE INNER PANEL SURFACE AND SHADOW MASK EFFECTIVE SURFACE SHAPES

BACKGROUND OF THE INVENTION

The present invention relates to a color cathode ray tube with a panel having a substantially flat outer surface, and more particularly, to a color cathode ray tube improved in visibility and in strength for the maintenance of a curved surface of a shadow mask.

Generally, a color cathode ray tube has a vacuum envelope that is composed of a glass panel and a glass funnel. In the color cathode ray tube, three electron beams emitted from an electron gun assembly in a neck of the funnel are deflected by a magnetic field that is generated by a deflection yoke attached to the outside of the funnel. A phosphor screen, which is formed of three-color phosphor layers on the inner surface of an effective portion of the panel, is scanned horizontally and vertically with the electron beams transmitted through the shadow mask, whereupon a color image is displayed on the screen.

In the color cathode ray tube of this type, in general, a side wall or skirt portion is attached to the peripheral portion of a faceplate that has a substantially rectangular effective portion. In order to obtain strength high enough to stand the load of the atmospheric pressure that acts on the vacuum envelope, the panel is formed having different curved surfaces as its inner and outer surfaces so that the central portion of the effective portion is thinner than the peripheral portion. Moreover, the outer surface of the effective portion is a curved surface such that its height above sealed surfaces of the panel and the funnel is greatest in the central portion and is reduced with distance from the central portion. More specifically, the outer surface of the effective portion is a spherical surface, a cylindrical surface having an infinite curvature radius in the minor-axis direction and a curvature in the major-axis direction, or a curved surface that can be represented by a high-order polynominal expression.

Flattening the outer surface of the effective portion of the panel has recently been promoted to improve the visibility of images. Described in Jpn. Pat. Appln. KOKAI Publication No. 9-245685 is an example of an improved panel in which the outer surface of the effective portion is a substantially flat surface and the inner surface is a substantially cylindrical curved surface having a substantially infinite curvature radius in the major-axis direction and a curvature in the minor-axis direction.

The visibility of an image formed on the phosphor screen is influenced by the shape of the inner surface of the effective portion, which is fitted with the screen, as well as by the shape of the outer surface of the effective portion. In the case where the outer and inner surfaces of the effective portion are different, the difference in thickness between the central and peripheral portions of the effective portion has no substantial influence on the visibility if it is small. If the outer surface is flattened so that the difference in thickness between the central and peripheral portions increases, however, the influence of the difference in thickness is remarkable.

In order to improve the visibility, both the inner and outer surfaces of the effective portion should preferably be flat. In the case of a panel, such as the one described in Jpn. Pat. Appln. KOKAI Publication No. 9-245685, in which the outer surface of the effective portion is a substantially flat surface and the inner surface is a substantially cylindrical curved surface having a substantially infinite curvature radius in the major-axis direction and a curvature in the minor-axis direction, however, the curvature of the short-side inner surface of the effective portion sometimes may be seen sideways from the short sides, although the effective portion frontally looks rectangular. Accordingly, the panel is expected to be further improved for the enhancement of the visibility or the display of flat images, which is a primary object of the flattening of the outer surface of the effective portion.

In the process of molding this glass panel, moreover, the cooling speed of glass varies due to the great difference in thickness between the central and peripheral portions, so that accurate curved surfaces cannot be obtained, in some cases.

On the other hand, the shadow mask is composed of a substantially rectangular mask body with a thickness of about 0.1 to 0.3 mm and a substantially rectangular mask frame attached to the peripheral portion of the mask body. A large number of beam apertures are formed in an effective surface of the mask body that faces the phosphor screen on the inner surface of the effective portion of the panel.

In general, the effective surface of the mask body must sustain a predetermined relation to the inner surface of the effective portion of the panel, so that these surfaces are similar curved surfaces. The shadow mask of the conventional color cathode ray tube has a curved surface whose profile is highest in the central portion and is reduced with distance from the central portion when the panel is turned upward. More specifically, the curved surface of the shadow mask, like that of the panel, is a spherical surface, a cylindrical surface having an infinite curvature radius in the minor-axis direction and a curvature in the major-axis direction, or a curved surface that can be represented by a high-order polynominal expression.

In the case of the panel in which the outer surface of the effective portion is a substantially flat surface and the inner surface is a substantially cylindrical curved surface having a substantially infinite curvature radius in the major-axis direction and a curvature in the minor-axis direction, the effective surface of the mask body of the corresponding shadow mask, like the inner surface of the effective portion of the panel, must be a cylindrical surface having a substantially infinite curvature radius in the major-axis direction and a curvature radius in the minor-axis direction. One such shadow mask is described in Jpn. Pat. Appln. No. 9-3632.

In general, the strength for the maintenance of the curved surface of the shadow mask is settled depending on the shape of the curved surface of the effective surface of the mask body, the thickness of the mask body, and the configuration, size, and arrangement of the electron beam apertures. If the thickness of the mask body and the configuration, size, and arrangement of the electron beam apertures are fixed, therefore, the curved surface maintenance strength of the shadow mask is settled depending on the shape of the curved surface of the effective surface.

If the maximum and minimum curvature radii, among curvature radii in all directions with respect to an optional point on the effective surface, are Rmax and Rmin, respectively, as indexes for the curved surface maintenance strength of the shadow mask, there is an average curvature that can be defined by the sum (1/Rmax+1/Rmin) of the minimum and maximum curvatures 1/Rmax and 1/Rmin, the respective reciprocals of the maximum and minimum curvature radii.

If the depth of depression (difference in distance along the tube axis between the center and each diagonal portion of the mask) of each diagonal portion of the effective surface of the conventional shadow mask at which the depression has its maximum is fixed, the curved surface maintenance strength can be enhanced by forming the effective surface in the shape of a cylindrical surface that has the highest average curvature, as in the case of the shadow mask described in Jpn. Pat. Appln. No. 9-3632.

In a shadow mask that is combined with a panel in which the outer surface of the effective portion is a substantially flat surface, however, the depth of depression of each diagonal portion of the effective surface is so small that the curved surface maintenance strength cannot be great enough.

The reduced curved surface maintenance strength of the shadow mask has various bad influences on the performance of the color cathode ray tube.

If any external force or impact is applied to the color cathode ray tube, the curved effective surface of the shadow mask is easily deformed, so that the image quality is lowered. If the color cathode ray tube is subjected to vibration, moreover, it is liable to resonate and undergoes lowering of the color purity (i.e., howling). If the shadow mask undergoes local thermal expansion attributable to collision of high-density electron beams in locally displaying bright images by means of the high-density electron beams, the color purity is lowered by the resulting local doming. The lowering of the color purity attributable to the local doming advances to the highest degree in intermediate regions 2 of a picture 1 a little nearer to short sides S0 than to the center, in the major-axis direction (i.e., X-axis direction), as shown in FIG. 1.

In general, the local doming is believed to be able to be effectively restrained by applying residual stress to the effective surface of the mask body. In connections with this, the curved surface maintenance strength of the shadow mask serves to restrain thermal expansion of the shadow mask. The reduction of the curved surface maintenance strength of the shadow mask, especially the effective surface, on the major axis accelerates the lowering of the color purity attributable to the local doming.

As mentioned before, flattening the color cathode ray tube has recently been promoted to improve the visibility of images. A panel has been proposed in which the outer surface of the effective portion is a substantially flat surface and the inner surface is a substantially cylindrical curved surface having a substantially infinite curvature radius in the major-axis direction and a curvature radius in the minor-axis direction.

In the panel of this type, however, there is a great difference in thickness between the central and peripheral portions of the effective portion, so that the curvature of the short-side inner surface of the effective portion sometimes may be seen sideways from the short sides. Thus, there is room for further improvement of the panel in view of the display of flat images, and desired visibility cannot be obtained. If the difference in thickness is too great in the process of molding the panel, moreover, the cooling speed of glass varies, so that accurate curved surfaces cannot be obtained, in some cases.

On the other hand, a shadow mask corresponding to the panel has been proposed in which the effective surface of the mask body is a substantially cylindrical curved surface having a substantially infinite curvature radius in the major-axis direction and a curvature radius in the minor-axis direction.

In the shadow mask of this type, however, the depth of depression of each diagonal portion of the effective surface is so small that the curved surface maintenance strength cannot be great enough. If any external force or impact is applied to the color cathode ray tube, therefore, the curved effective surface of the shadow mask is easily deformed, so that the image quality is lowered. If the color cathode ray tube is subjected to vibration, moreover, it is liable to resonate and undergoes lowering of the color purity. In locally displaying bright images by means of high-density electron beams, moreover, the shadow mask undergoes thermal expansion attributable to collision of the high-density electron beams, and the color purity is lowered by local doming. Further, the mask body is liable to suffer side cutout or the like, so that it is difficult to obtain a curved surface with a predetermined curvature radius.

BRIEF SUMMARY OF THE INVENTION

The object of the present invention is to improve the visibility of a color cathode ray tube with a panel having a substantially flat outer surface and improve the curved surface maintenance strength of a shadow mask.

In order to achieve the above object, according to the present invention, there is provided a color cathode ray tube comprising: a panel including a substantially rectangular effective portion of which the outer surface is a flat surface or a slightly curved surface; and a shadow mask having an effective surface opposite the inner surface of the effective portion of the panel, the effective surface having therein a large number of electron beam apertures, the inner surface of the effective portion of the panel being a curved surface having a substantially infinite curvature radius in the major-axis direction on the major axis thereof near the center, a predetermined curvature radius in the major-axis direction near peripheral portions on the major axis, and another predetermined curvature radius in the minor-axis direction on the minor axis thereof.

In the color cathode ray tube described above, the inner surface of the effective portion of the panel is a curved surface having a substantially fixed curvature radius in the major-axis direction near peripheral portions on the major axis and another substantially fixed curvature radius in the minor-axis direction on the minor axis.

In the color cathode ray tube described above, the inner surface of the effective portion of the panel is a curved surface having a substantially fixed curvature radius in the minor-axis direction on the minor axis near the center and another curvature radius near peripheral portions on the minor axis, the second curvature radius being shorter than the curvature radius in the minor-axis direction near the center.

According to the invention, there is provided a color cathode ray tube comprising: a panel including a substantially rectangular effective portion of which the outer surface is a flat surface or a slightly curved surface; and a shadow mask having an effective surface opposite the inner surface of the effective portion of the panel, the effective surface having therein a large number of electron beam apertures, there being relations $Cp>Hp>Vp$, where the direction of a tube axis toward the outer surface of the panel is regarded as a positive direction, and where Cp, Hp, and Vp are the tube-axis coordinates of the center, major-axis end, and minor-axis end of the inner surface of the effective portion of the panel, respectively.

According to the invention, there is provided a color cathode ray tube comprising: a panel including a substantially rectangular effective portion of which the outer surface is a flat surface or a slightly curved surface; and a shadow mask having an effective surface opposite the inner surface of the effective portion of the panel, the effective surface having therein a large number of electron beam apertures, there being relations Cp>Hp>Vp≧Dp, where the direction of a tube axis toward the outer surface of the panel is regarded as a positive direction, and where Cp, Hp, Vp and Dp are the tube-axis coordinates of the center, major-axis end, minor-axis end, and diagonal-axis end of the inner surface of the effective portion of the panel, respectively.

According to the invention, there is provided a color cathode ray tube comprising: a panel including a substantially rectangular effective portion of which the outer surface is a flat surface or a slightly curved surface; and a shadow mask having an effective surface opposite the inner surface of the effective portion of the panel, the effective surface having therein a large number of electron beam apertures, the effective surface of the shadow mask being a curved surface having a substantially infinite curvature radius in the major-axis direction on the major axis thereof near the center, a predetermined curvature radius in the major-axis direction near peripheral portions on the major axis, and another predetermined curvature radius in the minor-axis direction on the minor axis thereof.

In the color cathode ray tube described above, the effective surface of the shadow mask is a curved surface having a substantially fixed curvature radius in the major-axis direction near peripheral portions on the major axis and another substantially fixed curvature radius in the minor-axis direction on the minor axis.

In the color cathode ray tube described above, the effective surface of the shadow mask is a curved surface having a substantially fixed curvature radius in the minor-axis direction on the minor axis near the center and another curvature radius near peripheral portions on the minor axis, the second curvature radius being shorter than the curvature radius in the minor-axis direction near the center.

According to the invention, there is provided a color cathode ray tube comprising: a panel including a substantially rectangular effective portion of which the outer surface is a flat surface or a slightly curved surface; and a shadow mask having an effective surface opposite the inner surface of the effective portion of the panel, the effective surface having therein a large number of electron beam apertures, there being relations Cm>Hm>Vm, where the direction of a tube axis toward the outer surface of the panel is regarded as a positive direction, and where Cm, Hm and Vm are the tube-axis coordinates of the center, major-axis end, and minor-axis end of the effective surface of the shadow mask, respectively.

According to the invention, there is provided a color cathode ray tube comprising: a panel including a substantially rectangular effective portion of which the outer surface is a flat surface or a slightly curved surface; and a shadow mask having an effective surface opposite the inner surface of the effective portion of the panel, the effective surface having therein a large number of electron beam apertures, there being relations Cm>Hm>Vm≧Dm, where the direction of a tube axis toward the outer surface of the panel is regarded as a positive direction, and where Cm, Hm, Vm and Dm are the tube-axis coordinates of the center, major-axis end, minor-axis end, and diagonal-axis end of the effective surface of the shadow mask, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A color cathode ray tube according to one embodiment of the present invention will now be described with reference to the accompanying drawings.

Figure 1:
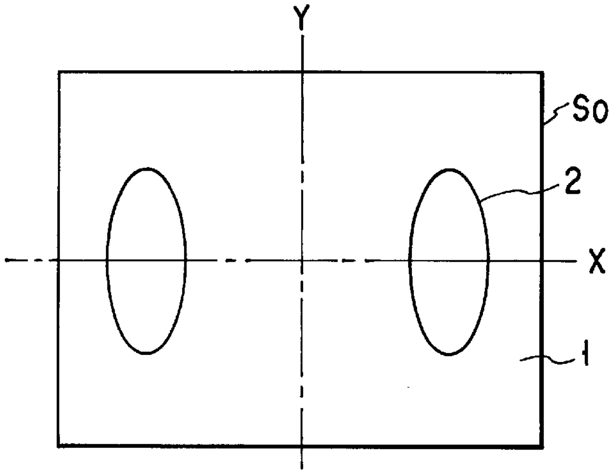
FIG. 1 is a diagram showing those portions of a shadow mask of a conventional color cathode ray tube which are liable to undergo local doming.
Figure 2:
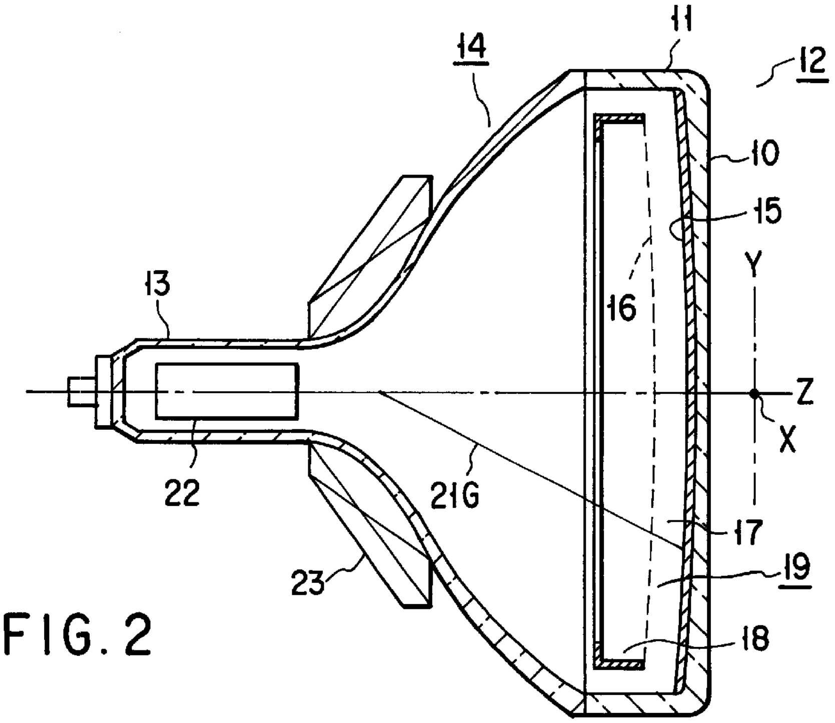
FIG. 2 is a view showing a configuration of a color cathode ray tube according to one embodiment of the present invention.

FIG. 2 shows the color cathode ray tube according to the one embodiment of the invention. The color cathode ray tube comprises a vacuum envelope, which is composed of a substantially rectangular panel 12 and a funnel 14. A side wall, i.e. skirt 11 of the panel 12 is attached to the peripheral portion of a faceplate that includes a substantially rectangular effective portion 10. The major axis of the effective portion 10 is a horizontal axis (i.e. X-axis) that crosses a tube axis (i.e. Z-axis) at right angles thereto, and the minor axis is a vertical axis (i.e. Y-axis). The funnel 14, which has a cylindrical neck 13 on its one end side, is bonded to an end portion of the side wall 11 of the panel 12. A phosphor screen 15 is provided on the inner surface of the effective portion 10 of the panel 12. The screen 15 is formed of three-color phosphor layers that radiate blue, green, and red, individually.

Further, a shadow mask 19 is located inside the panel 12. The mask 19 includes a mask body 17 and a mask frame 18 attached to the peripheral portion of the body 17. The mask body 17 has an effective surface 16 that faces the phosphor screen 15 at a given distance therefrom. A large number of electron beam apertures are formed at regular intervals in the effective surface 16. On the other hand, an electron gun 22 is located in the neck 13 of the funnel 14. The gun 22 emits three electron beams 21B, 21G and 21R (only 21G is shown).

The three electron beams 21B, 21G and 21R emitted from the electron gun 22 are deflected by a magnetic field that is generated by a deflection yoke, i.e. deflection unit 23. The deflection yoke 23 is attached to the outside of the funnel 14. A color image is displayed as the phosphor screen 15 is scanned horizontally and vertically with the electron beams transmitted through the electron beam apertures in the shadow mask 19.

Figure 3:
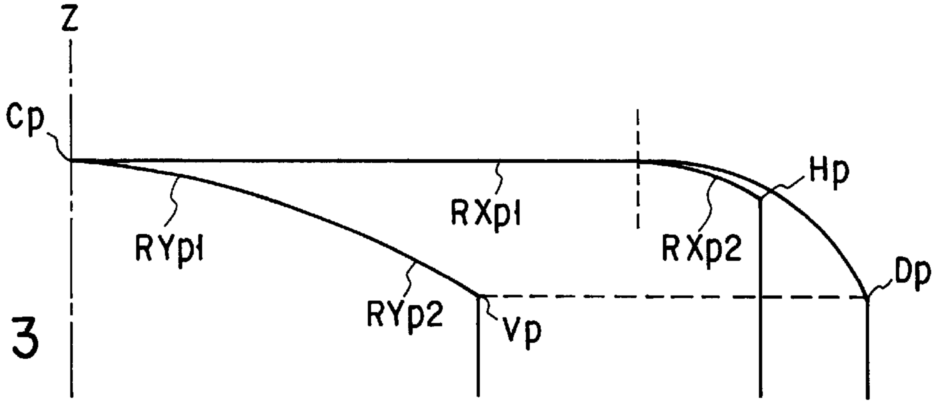
FIG. 3 is a diagram for illustrating the shape of the inner surface of an effective portion of a panel of the color cathode ray tube shown in FIG. 2.

In this color cathode ray tube, in particular, the outer surface of the effective portion 10 of the panel 12 is a substantially flat surface or a slightly curved surface. As shown in FIG. 3, on the other hand, the inner surface of the effective portion 10 is a curved surface (not shown) that has a substantially infinite curvature radius RXp1 in the major-axis direction on the major axis near the center, that is, within a plane that is defined by the major axis and the tube axis and planes parallel thereto, a substantially fixed curvature radius RXp2 in the major-axis direction near peripheral portions on the major axis, and a substantially fixed curvature radius in the minor-axis direction on the minor axis, that is, within a plane that is defined by the minor axis and the tube axis and planes parallel thereto. Alternatively, the inner surface of the effective portion 10 is a curved surface that has a substantially fixed curvature radius RYp1 in the minor-axis direction on the minor axis near the center and a curvature radius RYp2 near peripheral portions on the minor axis. The curvature radius RYp2 is shorter than the curvature radius RYp1 near the center (RYp2<RYp1).

Thus, if the direction of the tube axis (i.e. Z-axis) toward the outer surface of the panel 12 is regarded as a positive direction, and if the tube-axis coordinates of the center, major-axis end, minor-axis end, and diagonal-axis end of the inner surface of the effective portion 10 are Cp, Hp, Vp, and Dp, respectively, there are relations Cp>Hp>Vp or Cp>Hp>Vp≧Dp.

If the outer surface of the effective portion 10 of the panel 12 is a substantially flat surface or a slightly curved surface, then it will be perfectly flat or the average curvature radius that covers the area from the center of the effective portion 10 to the diagonal ends will be 10,000 mm or longer.

Figure 4:
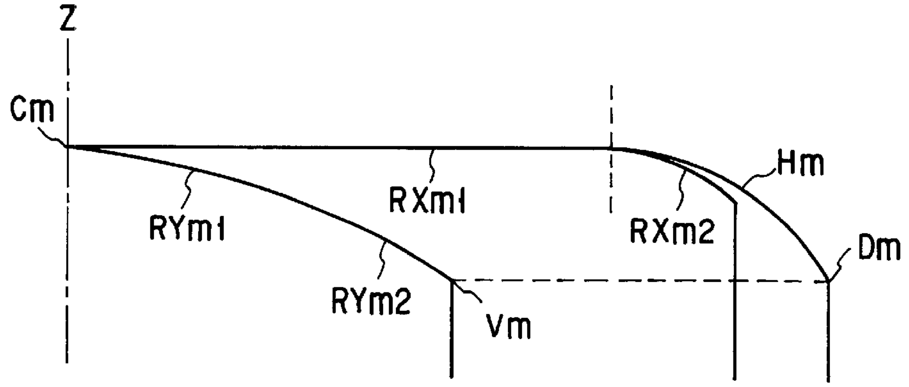
FIG. 4 is a diagram for illustrating the shape of an effective surface of a mask body of a shadow mask of the color cathode ray tube shown in FIG. 2.

In the shadow mask 19, as shown in FIG. 4, on the other hand, the effective surface 16 of the mask body 17 is a curved surface (not shown) that has a substantially infinite curvature radius RXm1 in the major-axis direction on the major axis near the center, that is, within a plane that is defined by the major axis and the tube axis and planes parallel thereto, a substantially fixed curvature radius RXm2 in the major-axis direction near peripheral portions on the major axis, and a substantially fixed curvature radius in the minor-axis direction on the minor axis, that is, within a plane that is defined by the minor axis and the tube axis and planes parallel thereto. Alternatively, the effective surface 16 is a curved surface that has a substantially fixed curvature radius RYm1 in the minor-axis direction on the minor axis near the center and a curvature radius RYm2 near peripheral portions on the minor axis. The curvature radius RYm2 is shorter than the curvature radius RYm1 near the center (RYm2<RYm1).

Thus, if the direction of the tube axis toward the outer surface of the panel 12 is regarded as a positive direction, and if the tube-axis coordinates of the center, major-axis end, minor-axis end, and diagonal-axis end of the effective surface are Cm, Hm, Vm, and Dm, respectively, there are relations Cm>Hm>Vm or Cm>Hm>Vm≧Dm.

With the panel 12 and shadow mask 19 arranged in this manner, the color cathode ray tube, in which the outer surface of the effective portion 10 of the panel 12 is a substantially flat surface or a slightly curved surface, can enjoy improved visibility and higher curved surface maintenance strength of the shadow mask 19.

The following is a description of examples of the panel 12 and the shadow mask 19 of the color cathode ray tube.

EXAMPLE 1

The following is a description of the panel of a recently prevailing color cathode ray tube that has an aspect ratio of 16:9 and diagonal dimension of 76 cm.

In the panel of this color cathode ray tube, as shown in FIG. 3, the inner surface of the effective portion has the substantially infinite curvature radius RXp1 in the major-axis direction on the major axis near the center and the substantially fixed curvature radius RXp2 in the major-axis direction near peripheral portions on the major axis. Further, the inner surface has the substantially fixed curvature radius RYp1 in the minor-axis direction on the minor axis near the center and the curvature radius RYp2 near peripheral portions on the minor axis, the radius RYp2 being shorter than the radius RYp1.

TABLE 1 shows specific values of the curvature radii RXp1, RXp2, RYp1 and RYp2 in the major- and minor-axis directions.

TABLE 1

| | RXp1 | RXp2 | RYp1 | RYp2 |
|---|---|---|---|---|
| Curvature radius (mm) | ∞ | 500 | 1160 | 600 |

In this color cathode ray tube, as shown in TABLE 1, the curvature radii are given by RXp1=∞, RXp1≠RXp2, RYp1>RYp2.

If the direction of the tube axis toward the outer surface of the panel is regarded as a positive direction and the tube-axis coordinate Cp of the center of the inner surface of the effective portion as an origin (Cp=0), the tube-axis coordinates Hp, Vp and Dp of the major-axis end, minor-axis end, and diagonal-axis end of the inner surface of the effective portion take the values shown in TABLE 2, and the values Cp, Hp, Vp and Dp have relations Cp>Hp>Vp≧Dp.

TABLE 2

| | Center of effective portion | Minor-axis end | Major-axis end | Diagonal-axis end |
|---|---|---|---|---|
| Tube-axis coordinates | 0 | −15.6 | −3.8 | −15.6 |

In the vicinity of each short side of the inner surface of the effective portion of the panel, there is a curved surface that is obtained by smoothly connecting, in the minor-axis direction, curved lines with a fixed curvature radius that extend substantially parallel to the major axis between the short side and a boundary or a straight line (indicated by broken line in FIG. 3) parallel to the minor axis. The boundary passes through a point at which the curvature radius in the major-axis direction on the major axis changes from RXp1 into RXp2.

Alternatively, the curved surface near each short side of the inner surface of the effective portion may be a curved surface obtained by smoothly connecting, in the major-axis direction, curved lines with a fixed curvature radius that extend substantially parallel to the minor axis between each long side and the boundary. Alternatively, moreover, the curved surface near each short side may be a curved surface that can be represented by a high-order polynominal expression.

With the panel arranged in this manner, each short side closely resembles a straight line as viewed sideways, so that the visibility of an image formed on the phosphor screen on the inner surface of the effective portion can be improved.

Figure 5A:
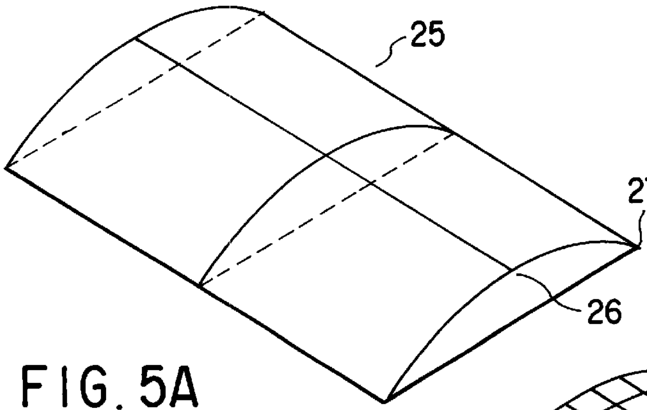
FIG. 5A is a schematic perspective view of a panel in which the outer surface of the effective portion is a substantially flat surface and the inner surface is a cylindrical surface having a substantially infinite curvature radius in the major-axis direction and a fixed curvature radius in the minor-axis direction.

FIG. 5A shows a panel 25 in which the outer surface of the effective portion is a substantially flat surface and the inner surface is a cylindrical surface having a substantially infinite curvature radius in the major-axis direction and a fixed curvature radius in the minor-axis direction. Although the effective portion of the panel 25 looks rectangular as viewed frontally, the curvature in the minor-axis direction is regarded directly as the curvature of the phosphor screen in the minor-axis direction, as viewed from each short side. The difference in level between each major-axis end 26 and each diagonal-axis end 27 makes each short side of the inner surface of the effective portion look arched. Thus, the image formed on the phosphor screen may be awkward.

Figure 5B:
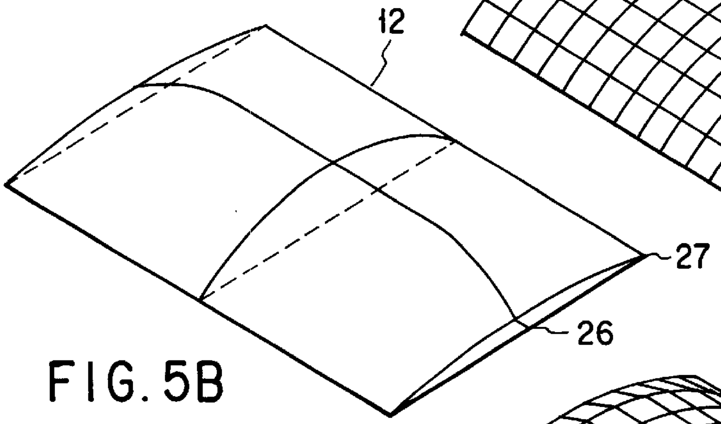
FIG. 5B is a schematic perspective view of a panel in which the outer surface of the effective portion is a substantially flat surface and the inner surface is a curved surface having a substantially infinite curvature radius in the major-axis direction on the major axis near the center, a substantially fixed curvature radius in the major-axis direction near peripheral portions on the major axis, another substantially fixed curvature radius in the minor-axis direction on the minor axis near the center, and a smaller curvature radius near peripheral portions on the minor axis.

If the panel is constructed in this manner, however, the difference in level between each major-axis end 26 and each diagonal-axis end 27 can be lessened, as shown in FIG. 5B. As viewed sideways, therefore, each short side of the inner surface of the effective portion closely resembles a straight line, so that the awkwardness of the image on the phosphor screen can be reduced.

In the embodiment described above, moreover, the curvature radius of the inner surface of the effective portion of the panel in the minor-axis direction is divided between two portions, the central and peripheral portions. However, the central and peripheral portions of the inner surface of the effective portion of the panel need not always have a substantially fixed curvature radius. The visibility of the image can be also improved in the case where the curvature radius changes with distance from the central portion.

Furthermore, the curvature radius in the major-axis direction need not always be substantially infinite in the central portion and fixed in the peripheral portion.

In any of these cases, however, it is essential that the relations between the respective positions of each major-axis end, minor-axis end, and diagonal-axis end with respect to the tube axis be Cp>Hp>Vp≧Dp.

EXAMPLE 2

The following is a description of the shadow mask of the recently prevailing color cathode ray tube that has an aspect ratio of 16:9 and diagonal dimension of 76 cm.

In the shadow mask of this color cathode ray tube, as shown in FIG. 4, the effective surface of the mask body has the substantially infinite curvature radius RXm1 in the major-axis direction on the major axis near the center and the substantially fixed curvature radius RXm2 in the major-axis direction near peripheral portions on the major axis. Further, the effective surface has the substantially fixed curvature radius RYm1 in the minor-axis direction on the minor axis near the center and the curvature radius RYm2 near peripheral portions on the minor axis, the radius RYm2 being shorter than the radius RYm1.

TABLE 3 shows specific values of the curvature radii RXm1, RXm2, RYm1 and RYm2 in the major- and minor-axis directions.

TABLE 3

| | RXm1 | RXm2 | RYm1 | RYm2 |
|---|---|---|---|---|
| Curvature radius (mm) | ∞ | 470 | 1160 | 600 |

In this color cathode ray tube, as shown in TABLE 3, the curvature radii are given by RXm1=∞, RXm1≠RXm2, RYm1>RYm2.

If the direction of the tube axis toward the outer surface of the panel is regarded as a positive direction and the tube-axis coordinate Cm of the center of the effective surface as an origin (Cm=0), the tube-axis coordinates Hm, Vm and Dm of the major-axis end, minor-axis end, and diagonal-axis end of the effective surface take the values shown in TABLE 4, and the values Cm, Hm, Vm and Dm have relations Cm>Hm>Vm≧Dm.

TABLE 4

| | Center of effective portion | Minor-axis end | Major-axis end | Diagonal-axis end |
|---|---|---|---|---|
| Tube-axis coordinates | 0 | −15.6 | −4.0 | −16.0 |

In the vicinity of each short side of the effective surface, there is a curved surface that is obtained by smoothly connecting, in the minor-axis direction, curved lines with a fixed curvature radius that extend substantially parallel to the major axis between the short side and a boundary or a straight line (indicated by broken line in FIG. 4) parallel to the minor axis. The boundary passes through a point at which the curvature radius in the major-axis direction on the major axis changes from RXm1 into RXm2.

Alternatively, the curved surface near each short side of the effective surface may be a curved surface obtained by smoothly connecting, in the major-axis direction, curved lines with a fixed curvature radius that extend substantially parallel to the minor axis between each long side and the boundary. Alternatively, moreover, the curved surface near each short side may be a curved surface that can be represented by a high-order polynominal expression.

Arranged in this manner, the shadow mask can be improved in curved surface maintenance strength.

Figure 6A:
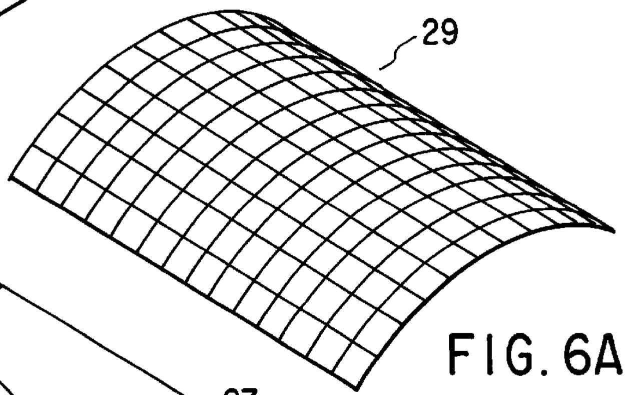
FIG. 6A is a schematic perspective view a shadow mask in which the effective surface of the mask body is a cylindrical surface having a substantially infinite curvature radius in the major-axis direction and a fixed curvature radius in the minor-axis direction.
Figure 6B:
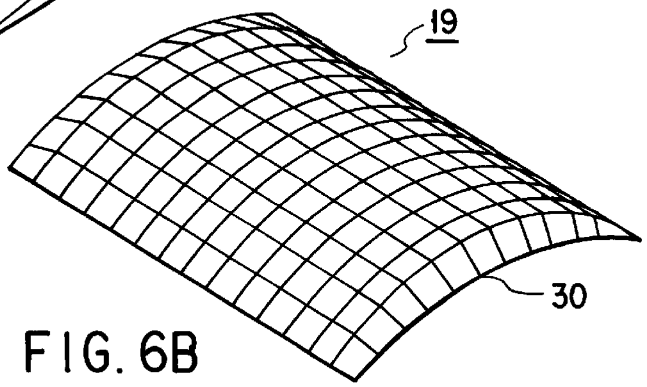
FIG. 6B is a schematic perspective view of a shadow mask in which the effective surface is a cylindrical surface having a substantially infinite curvature radius in the major-axis direction on the major axis near the center, a substantially fixed curvature radius in the major-axis direction near peripheral portions on the major axis, another substantially fixed curvature radius in the minor-axis direction on the minor axis near the center, and a smaller curvature radius near peripheral portions on the minor axis.

FIG. 6A shows a shadow mask 29 in which the effective surface is a cylindrical surface having a substantially infinite curvature radius in the major-axis direction and a fixed curvature radius in the minor-axis direction. On the other hand, FIG. 6B shows a shadow mask in which the effective surface is a cylindrical surface having a substantially infinite curvature radius in the major-axis direction on the major axis near the center and a substantially fixed curvature radius in the major-axis direction near peripheral portions on the major axis. In this case, each major-axis end is depressed below the center of the effective surface, so that substantially the same effect can be obtained as in the case where the curvature in the major-axis direction is increased, and the curved surface maintenance strength can be improved. On the other hand, the curvature radius near peripheral portions on the minor axis is made shorter than the curvature radius in the minor-axis direction near the center, so that substantially the same effect can be obtained as in the case where the curvature in the minor-axis direction is increased. The curved surface maintenance strength can be improved also for this reason.

Even if any external force or impact is applied to the color cathode ray tube, therefore, deformation of the effective surface can be restrained to prevent lowering of the image quality. Since the peripheral portions in the major-axis direction, which are particularly liable to resonance, are improved in curved surface maintenance strength, moreover, lowering of the color purity attributable to resonance can be prevented if the color cathode ray tube is subjected to vibration. Furthermore, the improved curved surface maintenance strength can prevent the color purity from being lowered by local doming that is caused by the collision of high-density electron beams. In particular, intermediate portions (with respect to the major-axis direction) near the short sides, which are very susceptible to local doming, can be effectively restrained from doming. Thus, the color purity can be prevented from being lowered by local doming.

In the embodiment described above, the curvature radius of the effective surface of the mask body in the minor-axis direction is divided between two portions, the central and peripheral portions. However, the curvature radius of the effective surface of the mask body need not always be divided between the central and peripheral portions, and it is necessary only that the curvature radius be shorter in the peripheral portions than in the central portion. Thus, the same effect of the foregoing embodiment can be obtained for the curvature radius in the minor-axis direction even in the case where the radius changes continuously.

It is essential, moreover, that the curvature radius in the major-axis direction be also shorter in the peripheral portions than in the central portion, and that the relations between the respective positions of each major-axis end, minor-axis end, and diagonal-axis end with respect to the tube axis be $Cm>Hm>Vm\geqq Dm$.

As described above, the visibility can be improved if the panel is designed so that the outer surface of the effective portion is a substantially flat surface or a slightly curved surface, the inner surface of the effective portion is a curved surface having a substantially infinite curvature radius in the major-axis direction on the major axis near the center, a predetermined curvature radius in the major-axis direction near peripheral portions on the major axis, and another predetermined curvature radius in the minor-axis direction on the minor axis, and more particularly, a curved surface having a substantially fixed curvature radius in the major-axis direction near peripheral portions on the major axis and another substantially fixed curvature radius in the minor-axis direction on the minor axis, or a curved surface having a substantially fixed curvature radius in the minor-axis direction on the minor axis near the center and a shorter curvature radius near peripheral portions on the minor axis, or that there are relations $Cp>Hp>Vp$ or $Cp>Hp>Vp\geqq Dp$, where Hp, Vp and Dp are the tube-axis coordinates of each major-axis end, minor-axis end, and diagonal-axis end of the inner surface of the effective portion, respectively.

Further, the curved surface maintenance strength can be improved if the shadow mask is designed so that the effective surface of the mask body is a curved surface having a substantially infinite curvature radius in the major-axis direction on the major axis near the center, a predetermined curvature radius in the major-axis direction near peripheral portions on the major axis, and another predetermined curvature radius in the minor-axis direction on the minor axis, and more particularly, a curved surface having a substantially fixed curvature radius in the major-axis direction near peripheral portions on the major axis and another substantially fixed curvature radius in the minor-axis direction on the minor axis, or a curved surface having a substantially fixed curvature radius in the minor-axis direction on the minor axis near the center and a shorter curvature radius near peripheral portions on the minor axis, or that there are relations $Cm>Hm>Vm$ or $Cm>Hm>Vm\geqq Dm$, where the direction of the tube axis toward the outer surface of the panel is regarded as a positive direction, and where Cm, Hm, Vm and Dm are tube-axis coordinates of the center, major-axis end, minor-axis end, and diagonal-axis end of the effective surface, respectively. Thus, lowering of the image quality attributable to deformation of the effective surface can be prevented when external force or impact is applied, the color purity can be prevented from being lowered by resonance or local doming, and the mask body having a given shape can be molded with ease.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A color cathode ray tube including an envelope extending from a rear tube portion to an opposed front tube portion including a substantially rectangular effective panel portion having an effective outer surface portion that is flat or only slightly curved and an effective inner surface portion, a shadow mask having an effective mask surface with apertures therein, an electron beam gun spaced from the shadow mask along a tube axis in a direction toward said rear tube portion, said electron beam gun being configured to generate electron beams, at least some of which pass through the apertures toward the effective inner surface portion, wherein the effective inner surface portion has an associated major axis and associated major axis coordinate defining a relative position of a major end point of the effective inner surface portion and an associated minor axis and associated minor axis coordinate defining a relative position of a minor end point of the effective inner surface portion, said major axis and said minor axis intersecting said tube axis at a central point on the effective inner surface portion, with the major end point relative position and the minor end point relative position including a tube axis coordinate in addition to coordinates related to the other axes, and with the tube axis coordinate of the major end point being spaced from the central point on the tube axis a distance measured toward the rear tube portion that is less than the distance of spacing of the minor end point from the central point measured toward the rear tube portion.

2. The color cathode ray tube according to claim 1, further wherein the effective inner surface portion has a radius of curvature that changes with distance along the major axis at least for a portion of the distance along the major axis from the central point to the major end point.

3. The color cathode ray tube according to claim 1, further wherein the effective inner surface portion has a major end side associated with the major end point and a minor end side associated with the minor end point, said major end side and said minor end side intersecting at a diagonal point having a relative position including a tube axis coordinate in addition to coordinates related to the other axes, with the tube axis coordinate of the diagonal point being spaced from the central point on the tube axis a distance measured toward the rear tube portion that is the same as or greater than the distance of spacing of the minor end point from the central point measured toward the rear tube portion on said tube axis.

4. The color cathode ray tube according to claim 3, further wherein the effective inner surface portion has a radius of curvature that changes with distance along the major axis at least for a portion of the distance along the major axis from the central point to the major end point.

5. A color cathode ray tube including an envelope extending from a rear tube portion to an opposed front tube portion including a substantially rectangular effective panel portion having an effective outer surface portion that is flat or only slightly curved and an effective inner surface portion, a shadow mask having an effective mask surface with apertures therein, an electron beam gun inside the envelope and spaced from the shadow mask along a tube axis in a direction toward said rear tube portion, said electron beam gun being configured to generate electron beams, at least some of which pass through the apertures toward the effective inner surface portion, wherein the effective mask surface has an associated major axis and associated major axis coordinate defining a relative position of a major end point of the effective mask surface portion and an associated minor axis and associated minor axis coordinate defining a relative position of a minor end point of the effective mask surface, said major axis and said minor axis intersecting said tube axis at a central point on the effective mask surface, with the major end point relative position and the minor end point relative position including a tube axis coordinate in addition to coordinates related to the other axes, and with the tube axis coordinate of the major end point being spaced from the tube axis coordinate of the central point a distance measured on the tube axis toward the rear tube portion that is less than the distance of spacing of the minor end point from the central point measured toward the rear tube portion on said tube axis.

6. The color cathode ray tube according to claim 5, further wherein the effective mask surface has a radius of curvature that changes with distance along the major axis at least for a portion of the distance along the major axis from the central point to the major end point.

7. The color cathode ray tube according to claim 6, further wherein the effective mask surface has a major end side associated with the major end point and a minor end side associated with the minor end point, said major end side and said minor end side intersecting at a diagonal point having a relative position including a tube axis coordinate in addition to coordinates related to the other axes, with the tube axis coordinate of the diagonal point being spaced from the central point on the tube axis a distance measured toward the rear tube portion that is the same as or greater than the distance of spacing of the minor end point from the central point measured toward the rear tube portion on said tube axis.

8. The color cathode ray tube according to claim 7, further wherein the effective mask surface has a radius of curvature that changes with distance along the major axis at least for a portion of the distance along the major axis from the central point to the major end point.

* * * * *